(12) United States Patent
Berner et al.

(10) Patent No.: US 11,652,126 B2
(45) Date of Patent: May 16, 2023

(54) EVENT-BASED VISION SENSOR MANUFACTURED WITH 3D-IC TECHNOLOGY

(71) Applicant: SONY ADVANCED VISUAL SENSING AG, Schlieren (CH)

(72) Inventors: Raphael Berner, Confignon (CH); Christian Brändli, Baden (CH); Massimo Zannoni, Zurich (CH)

(73) Assignee: SONY ADVANCED VISUAL SENSING AG, Schlieren (CH)

( * ) Notice: Subject to any disclaimer, the term of this patent is extended or adjusted under 35 U.S.C. 154(b) by 184 days.

(21) Appl. No.: 17/161,961

(22) Filed: Jan. 29, 2021

(65) Prior Publication Data

US 2021/0151492 A1    May 20, 2021

Related U.S. Application Data

(62) Division of application No. 16/297,267, filed on Mar. 8, 2019, now Pat. No. 10,923,520.

(60) Provisional application No. 62/642,838, filed on Mar. 14, 2018.

(51) Int. Cl.
  *H01L 27/146* (2006.01)
  *H04N 5/351* (2011.01)
  *H04N 5/369* (2011.01)
  *H01L 29/423* (2006.01)
  *H04N 5/3745* (2011.01)

(52) U.S. Cl.
  CPC .... *H01L 27/14634* (2013.01); *H01L 27/1469* (2013.01); *H01L 27/14614* (2013.01); *H01L 27/14636* (2013.01); *H01L 29/42364* (2013.01); *H04N 5/351* (2013.01); *H04N 5/379* (2018.08); *H04N 5/3745* (2013.01); *G06F 2201/86* (2013.01)

(58) Field of Classification Search
  CPC ......... H01L 27/14634; H01L 27/14614; H01L 27/14636; H01L 27/1469
  See application file for complete search history.

(56) References Cited

U.S. PATENT DOCUMENTS

| | | | |
|---|---|---|---|
| 7,728,269 | B2 | 6/2010 | Lichtsteiner et al. |
| 10,418,394 | B2 | 9/2019 | Sukegawa et al. |
| 2006/0146233 | A1 | 7/2006 | Park |
| 2011/0155893 | A1 | 6/2011 | Endo et al. |
| 2012/0267511 | A1 | 10/2012 | Kozlowski |
| 2013/0033632 | A1 | 2/2013 | Kishi |

(Continued)

FOREIGN PATENT DOCUMENTS

| | | |
|---|---|---|
| EP | 3576404 A1 | 12/2019 |
| EP | 3582491 A1 | 12/2019 |
| JP | 2006191081 A | 7/2006 |

(Continued)

OTHER PUBLICATIONS

"Back-Illuminated Sensors" Wikipedia, 3 pages (2019).

(Continued)

*Primary Examiner* — Anthony Ho
(74) *Attorney, Agent, or Firm* — HoustonHogle LLP

(57) ABSTRACT

An event-based vision sensor is fabricated using an advanced stacking technique, known as Three-Dimensional Integrated Circuit, which stacks more wafers (or dies) and interconnects them vertically. The electronic integrated circuits of the sensor are then distributed between the two or more electrically connected dies.

10 Claims, 19 Drawing Sheets

(56) References Cited

U.S. PATENT DOCUMENTS

2016/0358967 A1 12/2016 Madurawe et al.
2018/0191972 A1 7/2018 Berner et al.

FOREIGN PATENT DOCUMENTS

| JP | 2013009294 A | 1/2013 |
|---|---|---|
| JP | 2013530511 A | 7/2013 |
| JP | 2017059937 A | 3/2017 |
| JP | 2017209045 A | 11/2017 |
| JP | 2017209046 A | 11/2017 |
| KR | 20010034571 A | 2/2006 |
| KR | 20150068429 A | 6/2015 |
| KR | 10-2015-0082972 A | 7/2015 |
| WO | WO 2017009944 A1 | 1/2017 |
| WO | WO 2017013806 | 1/2017 |
| WO | WO 2017169480 A1 | 10/2017 |
| WO | WO 2018122798 | 7/2018 |
| WO | WO 2019087471 A1 | 5/2019 |
| WO | WO 2019087472 A1 | 5/2019 |

OTHER PUBLICATIONS

"Three-Dimensional Integrated Circuit," Wikipedia, 8 pages (2019).
International Search Report and Written Opinion of the International Searching Authority, dated May 31, 2019, from International Application No. PCT/IB2019/051920, filed on Mar. 8, 2019. 17 pages.
Habibi, M., "A Low Power Smart CMOS Image Sensor for Surveillance Applications," Machine Vision and Image Processing (MVIP): 1-4 (2010).
International Preliminary Report on Patentability, dated Sep. 24, 2020, from International Application No. PCT/IB2019/051920, filed on Mar. 8, 2019. 9 pages.

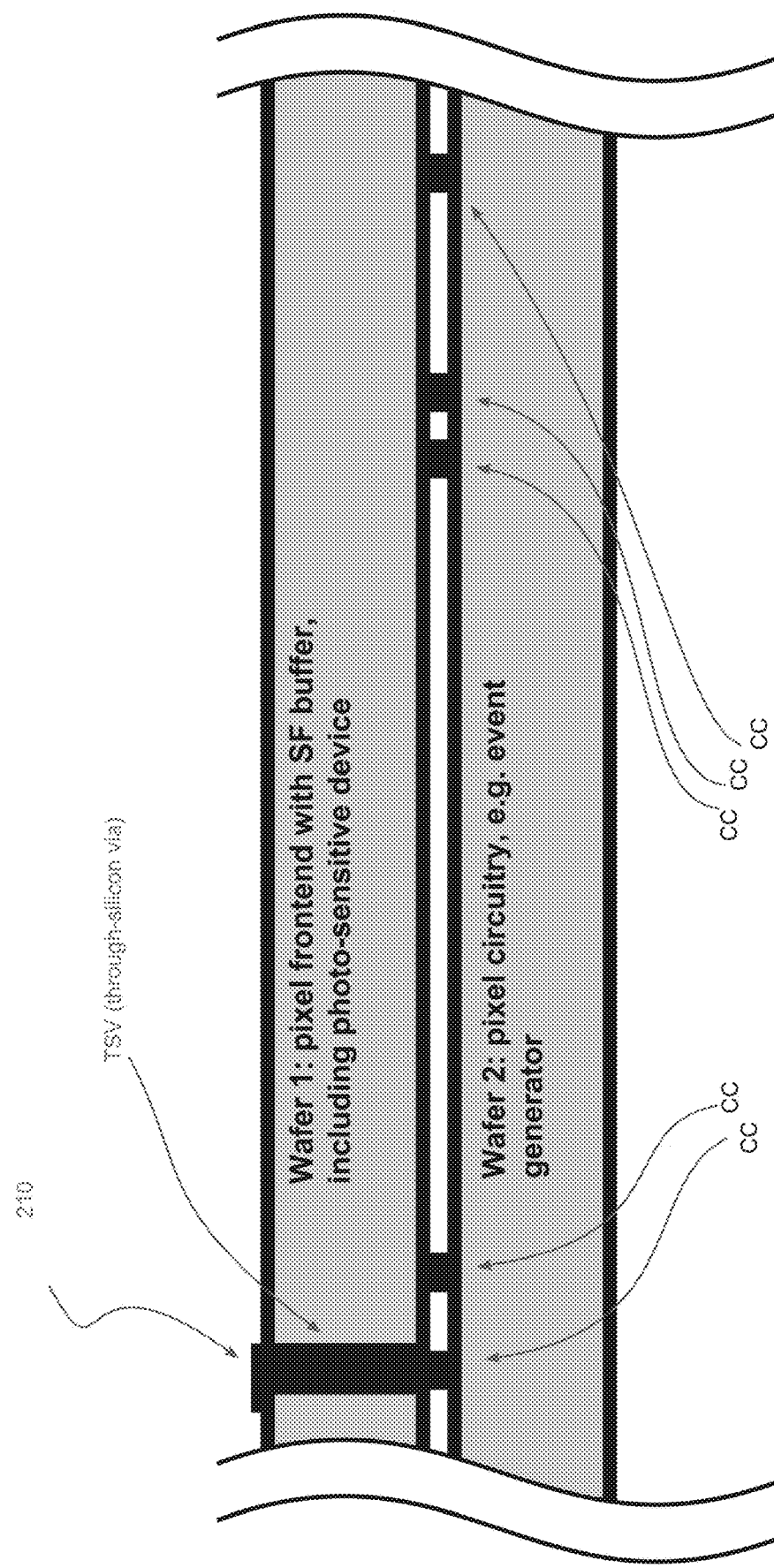

b. 3D IC process: vertical section of an IC (before dicing) realized using two stacked wafers, showing detailed metal and semiconductor stack, especially the MIM device

EVENT-BASED VISION SENSOR MANUFACTURED WITH 3D-IC TECHNOLOGY

RELATED APPLICATIONS

This application is a Divisional of U.S. patent application Ser. No. 16/297,267, filed Mar. 8, 2019, which claims the benefit under 35 USC 119(e) of U.S. Provisional Application No. 62/642,838, filed on Mar. 14, 2018, both of which are incorporated herein by reference in their entirety.

BACKGROUND OF THE INVENTION

One of the important parameters in the design of an event-based pixel array (also called Dynamic Vision Sensor (DVS)) is the quantum efficiency (QE), which is the ratio between the number of electrons generated in response of a light signal and the number of photons of that light signal. This parameter directly depends on the fill-factor (FF), which is the ratio between the area of the photo-sensitive device exposed to the light and all the area of the integrated circuit exposed to the light.

Since the event-based vision sensors today are realized using silicon planar process, the area exposed to the light must be shared between the photo-sensitive devices and the other semiconductor devices that form the pixel circuitry. This approach has two main disadvantages: the photo-sensitive devices area is limited and the circuitry that is not intended to be exposed to the light can have its performance degraded as a consequence of this radiation exposure.

SUMMARY OF THE INVENTION

The presented invention has the main purpose of mitigating these two issues by using in the fabrication of an event-based vision sensor an advanced stacking technique, known as Three-Dimensional Integrated Circuit, which stacks more wafers (or dies) and interconnects them vertically.

A number of motivations exist, including:

Increase FF;

Shield circuits that do not need/must not receive light; and

The different components of a pixels have different requirements, that can be best fulfilled by realizing them in different IC processes (the photo-sensitive devices could even theoretically be manufactured in a non-silicon-based technology, e.g. GaAs).

In general, according to one aspect, the invention features an Event-Based Vision Sensor (EBVS) including stacked dies that are connected vertically. As a result, photo-sensitive devices of each pixel of the pixel array can be located in the die exposed to illumination and other devices not useful for light capture can be in other wafers or dies.

Preferably, there is at least one connection for every pixel of the pixel array between the dies.

Typically, photodiodes of each pixel of the pixel array are in a first die and respective event detectors of each pixel of the pixel array in a second die and interconnections between the first and the die connect the photodiodes to respective event detectors.

This approach can be used with a frontside illumination architecture or backside illumination architecture.

Moreover, there are a number of different ways the photoreceptor circuit of each pixel of the pixel array can be implemented. For example, it can be located on the second die, or in the first die or distributed between the first die and the second die.

An additional amplification stage could be added in the first die.

Often n-FET transistors are used in the first wafer or die, and both n-FET and p-FET transistors are used in the second die.

In addition, the transistor properties between the transistors on the first die and the second die can be different including different gate oxide thicknesses or different implants.

In general, according to one aspect, the invention features a method for fabricating an Event-Based Vision Sensor. Generally, this method comprises fabricating different devices of each pixel of the pixel array in different wafers or dies and then stacking the wafers or dies.

As used here, a "die" is a piece or a portion of a semiconductor wafer, typically in a rectangular shape, such as a chip. Here, this piece of semiconductor wafer includes a portion of an instance of an integrated circuit device, such as the Event-Based Vision Sensor. The reference to wafer or die is based on the potential for differed fabrication approaches. The stacking can be performed at the wafer-level before dicing into dies. Or, the stacking can be performed on individual dies, after they have been cut away or diced from the wafer. As a result, the final device resulting from the fabrication process with be a stack of dies.

The method would then include connecting each of the pixels using Cu—Cu connections, for example.

In one implementation, the method further involves fabricating photodiodes of each pixel of the pixel array in a first wafer or die and fabricating respective event detectors of each pixel of the pixel array in a second wafer or die.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 2A refers to a front-side illumination (FSI) application; FIG. 2B refers to a back-side illumination (BSI) application;

FIGS. 5A-5D: A partial vertical cross-section of two (2) stacked wafers that shows the entire frontend in the top wafer, eventually including a source-follower stage (FIG. 5A); partial vertical cross-section focused on one pixel showing how the output from the first wafer can then directly connect to one of the plates of the MIM (metal-insulator-metal) capacitor of the event detector (which is located between the two topmost metals) on bottom wafer, this is shown in a simplified vertical section that includes details on the silicon process layers for the two stacked wafers (FIG. 5B); two circuit diagrams showing the details of the pixel frontend circuit also depicted (FIGS. 5C and 5D);

FIG. 7A is preferred; in FIGS. 7B and 7C it is shown how the elements of the circuit could be arranged between the wafers/dies such that the top wafer does not contain p-FET devices, showing how in this case more than two cross-wafer (or-die) connection per pixel are required.

DETAILED DESCRIPTION OF THE PREFERRED EMBODIMENTS

Figure 1:
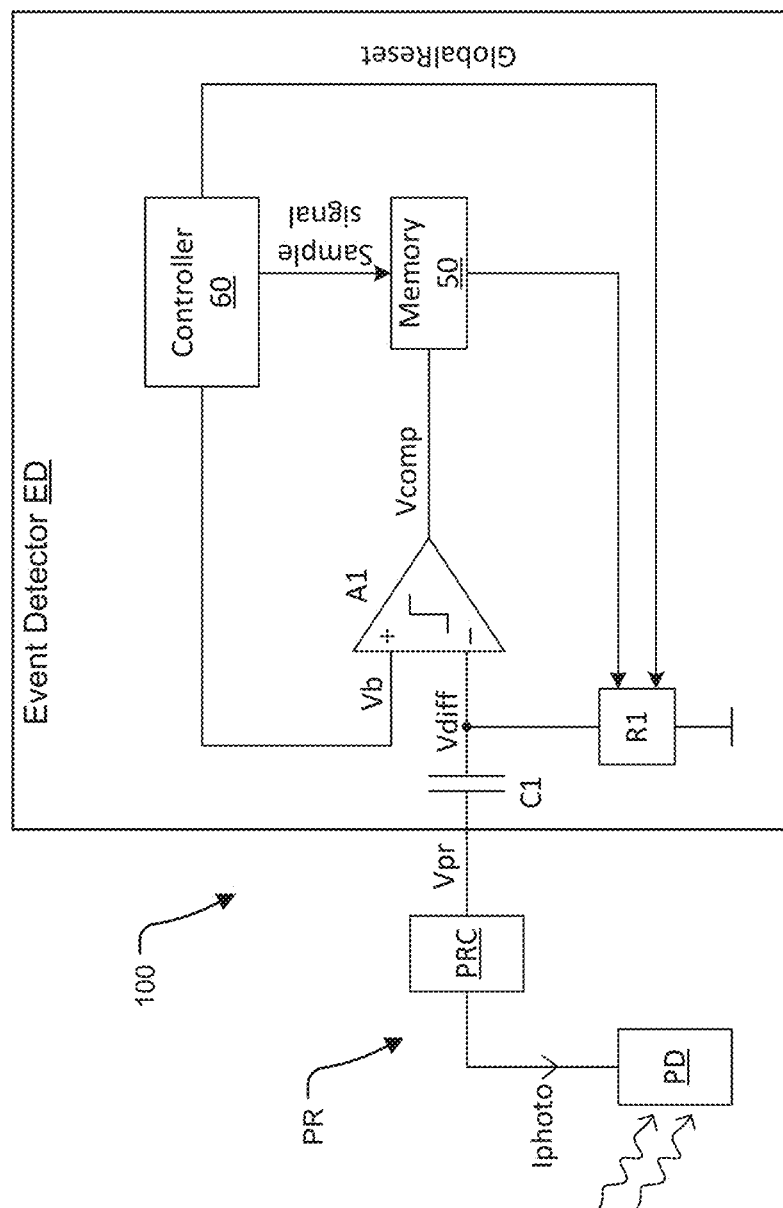
FIG. 1: Circuit diagram showing a state of the art (SOA) pixel implementation for an event-based image sensor, e.g. according to PCT/IB2017/058526 and U.S. Pub. No. 2018/0191972, for example.

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Definitions

An Event-Based Pixel Array (EBPA) is an array of pixels containing photo-sensitive devices; these pixels, spatially and/or temporally independent from each other, generate discretized data as function of the light radiation that they receive.

An Event-based Vision Sensor (EBVS) is a sensor that outputs data extracted and/or elaborated from an EBPA.

The Fill Factor (FF) is defined as the ratio between the area of a pixel and the area of the photo-sensitive device presented in that pixel. It is a measure of how much of the total light radiation that hits the surface of a sensor can be effectively captured by the sensor.

The Quantum Efficiency (QE) is defined as the ratio between the number of photons that hit the surface of a photo-sensitive sensor and the number of electrons that are generated in response and transformed into an electrical signal.

3D IC: acronym for Three-Dimensional Integrated Circuit; it is a technique to manufacture an integrated circuit by stacking silicon wafers or dies and interconnecting them vertically.

Front-Side Illumination (FSI): type of image sensor that is realized as an integrated circuit (IC), such that it is illuminated from the top of the die, which is the side onto which the layers of the planar process are realized; all the devices and the metal routing, together with the photo-sensitive devices, receive direct light radiation.

Back-Side Illumination (BSI): type of image sensor that is realized as IC, such that it is illuminated from the bottom of the die, which is the side of the substrate; the devices and the metal routing do not receive direct light radiation, but only through the substrate State-of-the-Art Examples of Event-Based Vision Sensor can be found, for examples, in PCT/IB2017/058526 or U.S. Pat. No. 7,728, 269B2 or U.S. Pub. No. 2018/0191972.

An example of pixel architecture of an EBPA of an EBVS, which will be used as reference in this document, is shown in FIG. 1. It is taken from PCT/IB2017/058526 and U.S. Pub. No. 2018/0191972, which is incorporated herein by this reference in its entirety. However, the core concepts in the proposed invention can be applied to virtually any Event-Based Vision Sensor realized as IC, not depending on any specific pixel architecture used.

The major components of a pixel circuit are enumerated below.

1. Photoreceptor module. As shown in the figure, the pixel circuit 100 contains a photodiode PD, or other photosensor, to measure impinging light and convert the light intensity to current Iphoto; a photoreceptor circuit PRC to generate a photoreceptor signal Vpr dependent on the light intensity; and a memory capacitor C1 to remember past photoreceptor signal. The photosensor PD and photoreceptor circuit PRC constitute the photoreceptor module PR.

2. Memory capacitor C1: Receives the photoreceptor signal Vpr such that first plate of the capacitor carries a charge that is responsive to the photoreceptor signal Vpr and thus the light received by the photosensor PD and is part of the event detector ED. A second plate of the memory capacitor C1 is connected to the comparator node (inverting input) of A1. Thus the voltage of the comparator node, Vdiff, varies with changes in the photoreceptor signal Vpr.

3. Comparator A1: This is a means to compare the difference between current photoreceptor signal Vpr and past photoreceptor signal to a threshold and is part of the event detector ED. This comparator A1 can be in each pixel, or shared between a subset (for example a column) of pixels. In the preferred embodiment the comparator will be integral to the pixel, with each pixel having a dedicated comparator A1.

4. Memory: Memory 50 stores the comparator output based on a sample signal from the controller 60 and is part of the event detector ED. Memory can be a sampling circuit (for example a switch and a parasitic or explicit capacitor) or a digital memory circuit (a latch or a flip-flop). In one embodiment, the memory will be a sampling circuit and each pixel will have two memories.

5. A conditional reset circuit R1: Condition for reset is a combination of the state of the memorized comparator output and a reset signal applied by the controller 60 and is part of the event detector ED.

6. Peripheral circuit components: The comparator A1 and the memory 50 can be located in the pixel or in peripheral circuits (outside the pixel circuit).

The peripheral circuits contain a controller 60 which applies threshold signals to the comparator A1, sends control signals to memory 50 and selects times when the conditional reset circuit R1 becomes active.

The peripheral circuits may also contain a readout circuit, which reads the content of the memory 50, determines if the light intensity for a given pixel has increased, decreased, or unchanged, and sends the output (computed from the current memory value) to a processor.

In more detail, the comparator tells if light has increased and/or decreased. For Off event: if Vdiff is lower than the threshold Voff (on Vb), the comparator output is high, and this level is stored in the memory. This means a decrease is detected. If Vdiff is not lower than the threshold, the comparator output is low: no decrease detected.

The only difficulty is that for On event, a low comparator output means an increase, while high means no change; but for Off event high comparator output means decrease while low means no change.

So the readout must know the memory content and which threshold was applied.

The pixel circuit 100 and controller 60 operate as follows.

A change in light intensity received by the photosensor PD will translate to a change in photoreceptor signal Vpr. When the reset circuit R1 is not conducting, the changes in Vpr will be reflected also in the voltage Vdiff at a comparator node at the inverting input (−) to the comparator A1. This occurs because the voltage across the memory capacitor C1 stays constant.

At times selected by the controller 60, the comparator A1 compares the voltage at the comparator node at the second terminal of the memory capacitor C1 (Vdiff) to a threshold voltage Vb (from controller) applied to the non-inverting input (+) of the comparator A1.

The controller 60 operates the memory 50 to store the comparator output Vcomp. The memory 50 is typically implemented as part of the pixel circuit 100 as shown. In other embodiments, however, the memory 50 is implemented as part of column logic circuit (peripheral circuit, one per each column of the pixel array).

If the state of the stored comparator output held in the memory 50 indicates a change in light intensity AND the global reset signal GlobalReset signal from the controller 60 is active, the conditional reset circuit R1 is conducting. Here "AND" indicates the logical AND operator. With the conditional reset circuit R1 in a conductive state, the voltage at the comparator node at the inverting input of the comparator A1 (Vdiff) is reset to a known level. Thus, it stores the current photoreceptor signal Vpr on the memory capacitor C1.

Until now, these EBVSs having EBPA of pixels as shown in FIG. 1 have been manufactured as integrated circuits using a silicon planar process on a single wafer. Using this technology, the semiconductor devices (e.g. MOS transistors, diodes and photo-diodes, polysilicon resistors, etc.) can be arranged only on a single layer, they cannot be vertically stacked.

Figure 2A:
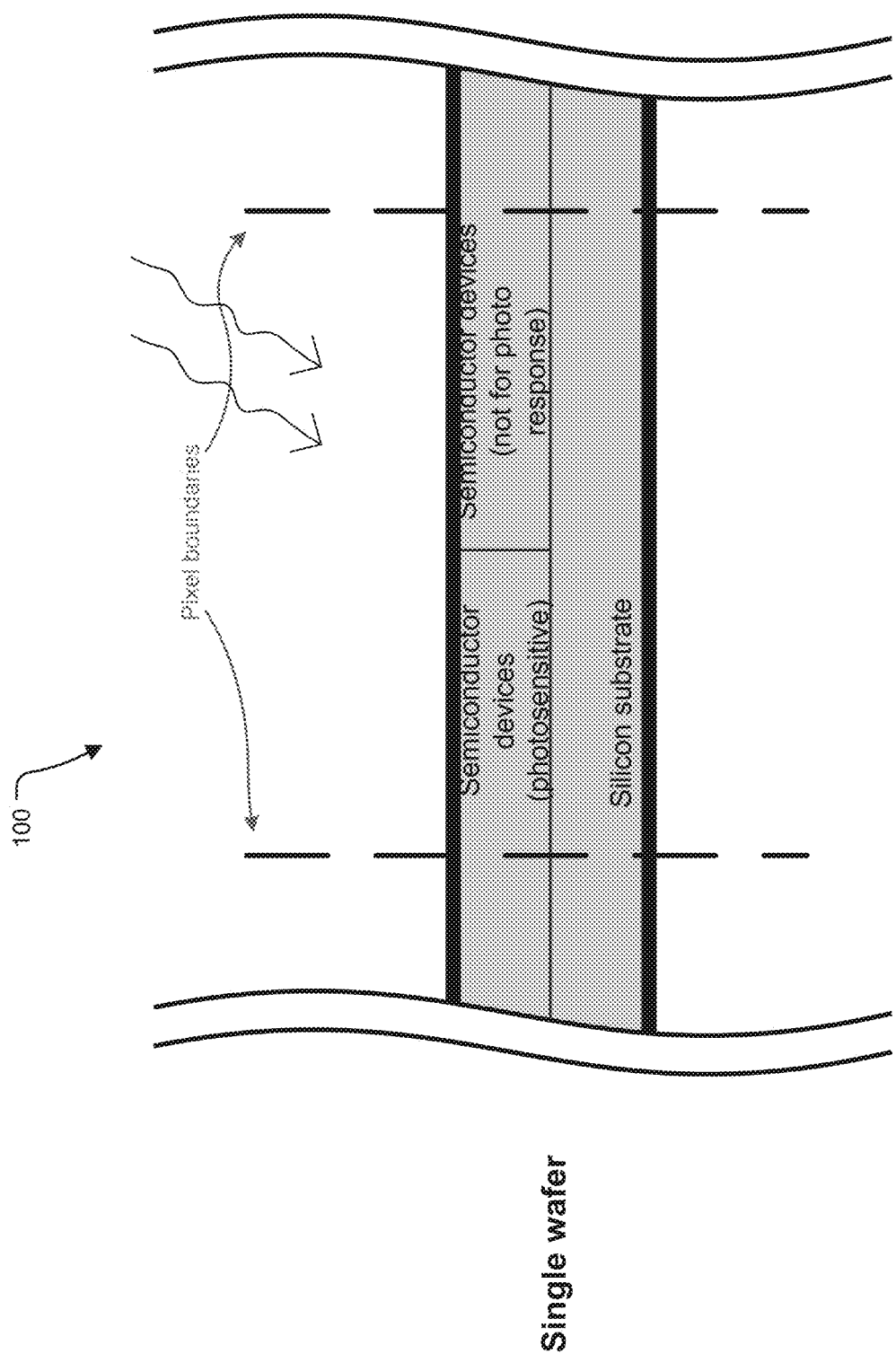
FIGS. 2A-2C: A SOA event-based image sensor: single wafer (partial vertical cross-section in FIG. 2A and FIG. 2B, partial top view in FIG. 2C) that implements the sensor.
Figure 2B:
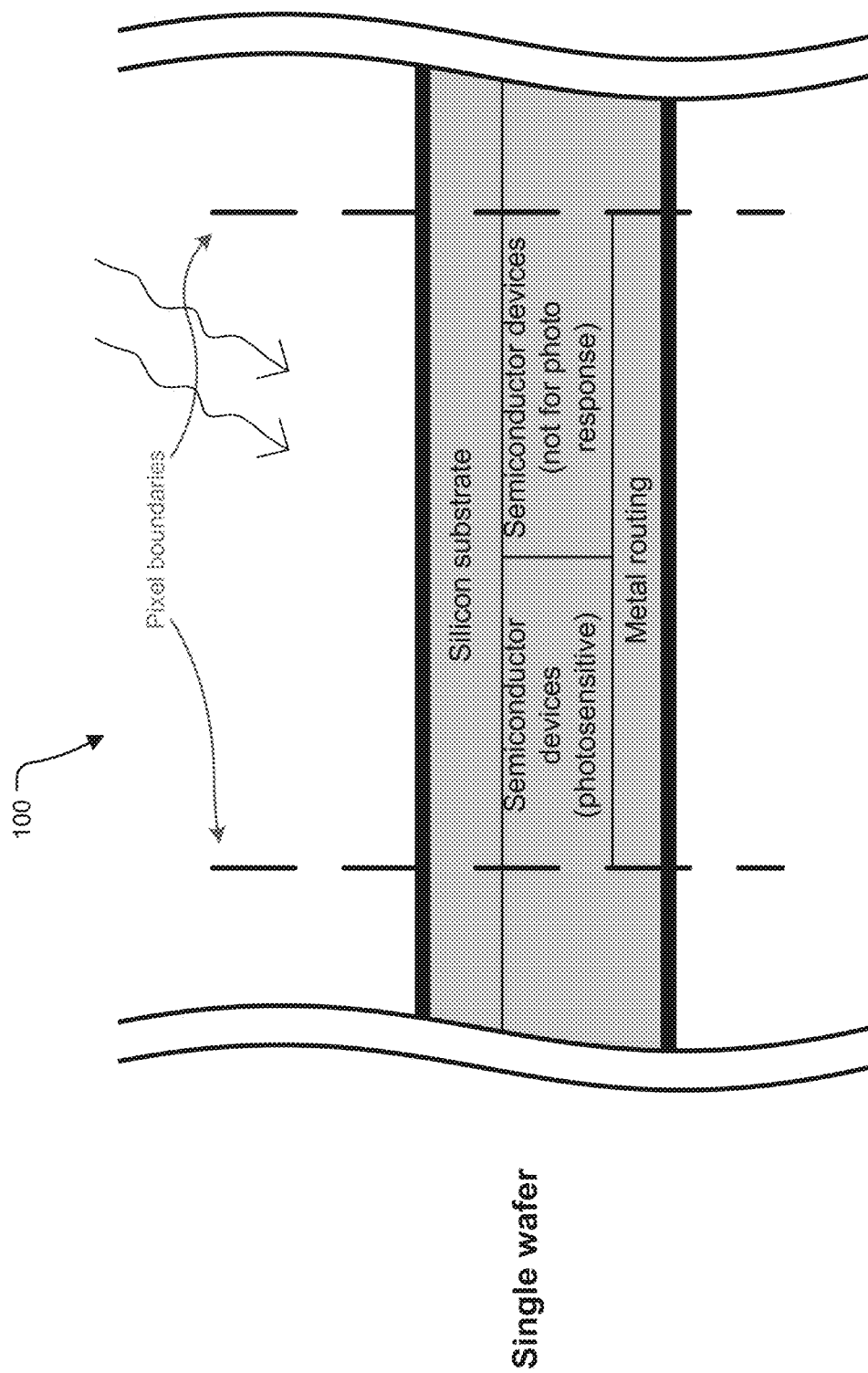
Figure 2C:
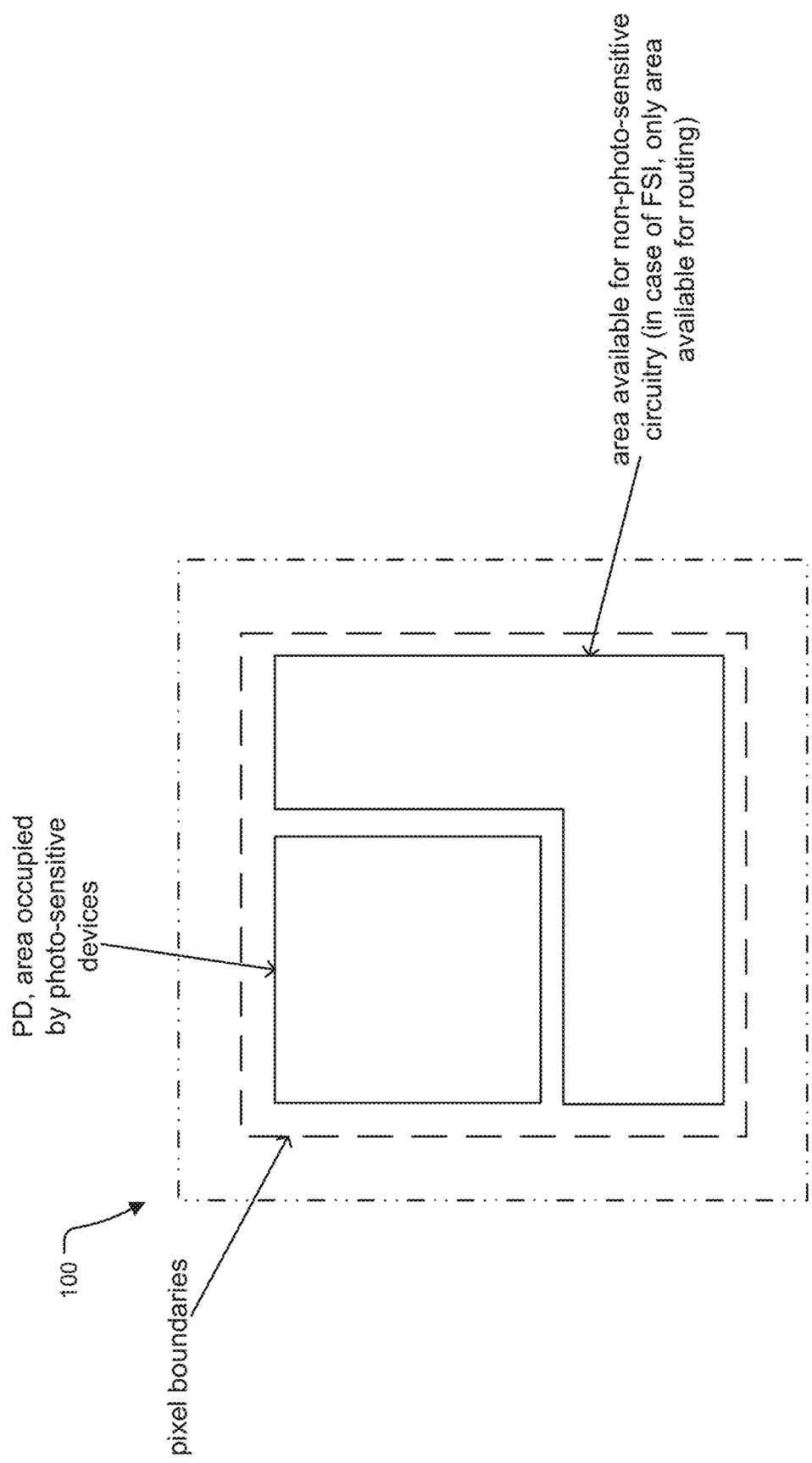

In this way, the area of a pixel 100 must be shared between the photo-sensitive devices, PD for example, and the rest of the circuit, as can be seen in FIG. 2A showing the frontside illumination architecture and 2B showing the backside illumination architecture, especially in FIG. 2C that shows the plan view. This means that the photo detectors PD cannot use all the light that hits the surface. Even if this issue can be mitigated by the use of a layer of micro-lenses, there will always be some part of the surface of the sensor that will absorb light radiation, without transforming it into a useful electrical signal.

Moreover, the light that hits the non-photo-sensitive devices can have non-desired effects, since some of the characteristics of these devices can be altered by the light that impinges on them. For example, an MOS transistor contains some semiconductor p-n junctions, typically, that can capture photo-generated carriers and create an unwanted signal in response.

A more advanced process technology, called back-side illumination (BSI), allows for improved use of the area available by exposing to the light the back-side of the wafer or die, which is the side of the silicon substrate. In this way there is more freedom for the routing metal connections, that can be placed over the photo-sensitive device in the pixel, while in a front-side illumination (FSI) technology the photo-sensitive device must be exposed to the light towards the top of the wafer, so no metal can be placed on top of the photo-sensitive devices, to maximize the light that is captured. The proposed invention gives advantages over both the BSI and the FSI approaches realized on a single wafer or die.

It is well known that an Event-Based Vision Sensor is based on an array of pixels, which generate data in response of the light that hits them, each of them spatially and/or temporally independently from the others.

Each of these pixels contains circuitry that is divided between a photo-sensitive part (e.g., photodiode PD) and a non-photo-sensitive part (e.g., photoreceptor circuit PRC, capacitor C1, comparator A1, memory 50 and reset circuit R1). This second part takes care of biasing the photo-sensitive circuitry, collecting the signal generated in response of the light and, frequently, of performing a first signal conditioning or elaboration. Examples of these types of pixel are referred in the previous section (State-of-the-art).

Typically, these sensors are manufactured as silicon integrated circuits (IC) based on a planar process. This means that the photo-sensitive part of a pixel and the rest of the circuitry must be realized using a single layer of semiconductor devices. The direct consequence of this is that part of the area of the pixel must be occupied by the non-photo-sensitive circuitry, effectively reducing the Fill Factor of the pixel (FIGS. 2A, 2B and 2C). Hence, the Quantum Efficiency is reduced. This is true also for back-side illuminated (BSI) ICs that are manufactured on a single wafer or die.

With the proposed invention, the Fill Factor of a pixel in an Event-Based Vision Sensor can be maximized, by means of stacking multiple wafers or dies, with a technique known as Three-Dimensional Integrated Circuit (3D IC).

Using this technology, it is possible to split the circuitry of a pixel between different wafers or dies, with the possibility of maximizing the area of photo-sensitive devices, since they can be overlapped to the non-photo-sensitive part of the circuit. Moreover, the circuitry that sits on a wafer below the top one, does not receive any (or almost any) light radiation, which is captured by the top wafer, allowing for a great reduction of the unwanted behavior in the non-photo-sensitive circuitry due to the impinging light.

Another advantage of this approach is that the two wafers or dies can be manufactured using two different technologic processes, allowing to select the best available process for both the photo-sensitive devices and the rest of the circuit. It is often the case that the technology requirements of these two types of circuitry do not fully overlap.

Examples of Embodiments

Figure 3A:
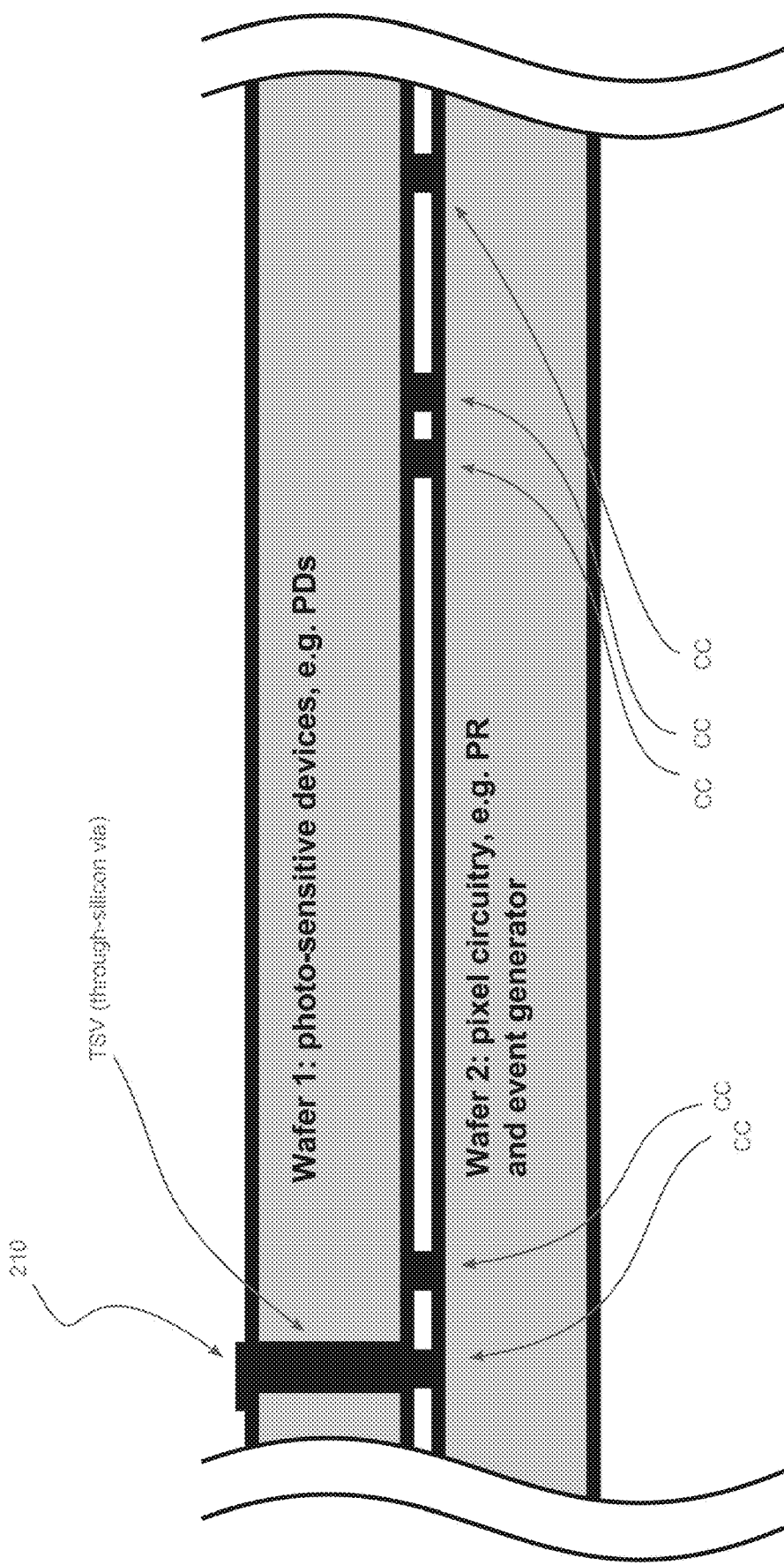
FIGS. 3A-3D: A partial vertical cross-section of two (2) stacked wafers that show a preferred embodiment before dicing the wafers (FIG. 3A); partial vertical cross-section focused on one pixel, showing a back-side illuminated (BSI) top wafer with only the photo-diode (PD) and a single connection per pixel to the bottom wafer (FIG. 3B); a block diagram (FIG. 3C) and a circuit diagram (FIG. 3D) showing the details of the pixel frontend circuit and how it is arranged between the wafers/dies.
Figure 3B:
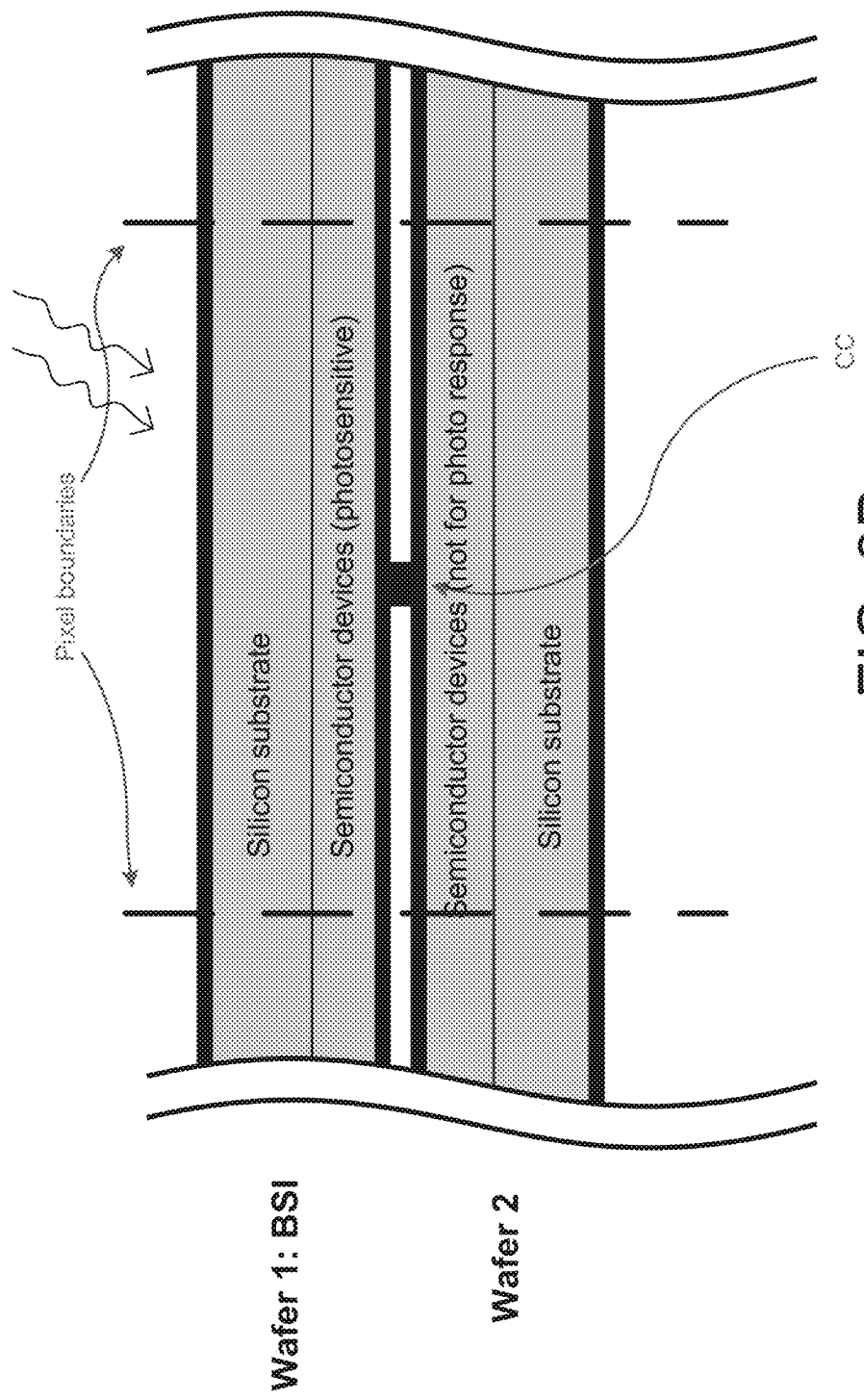
Figure 3C:
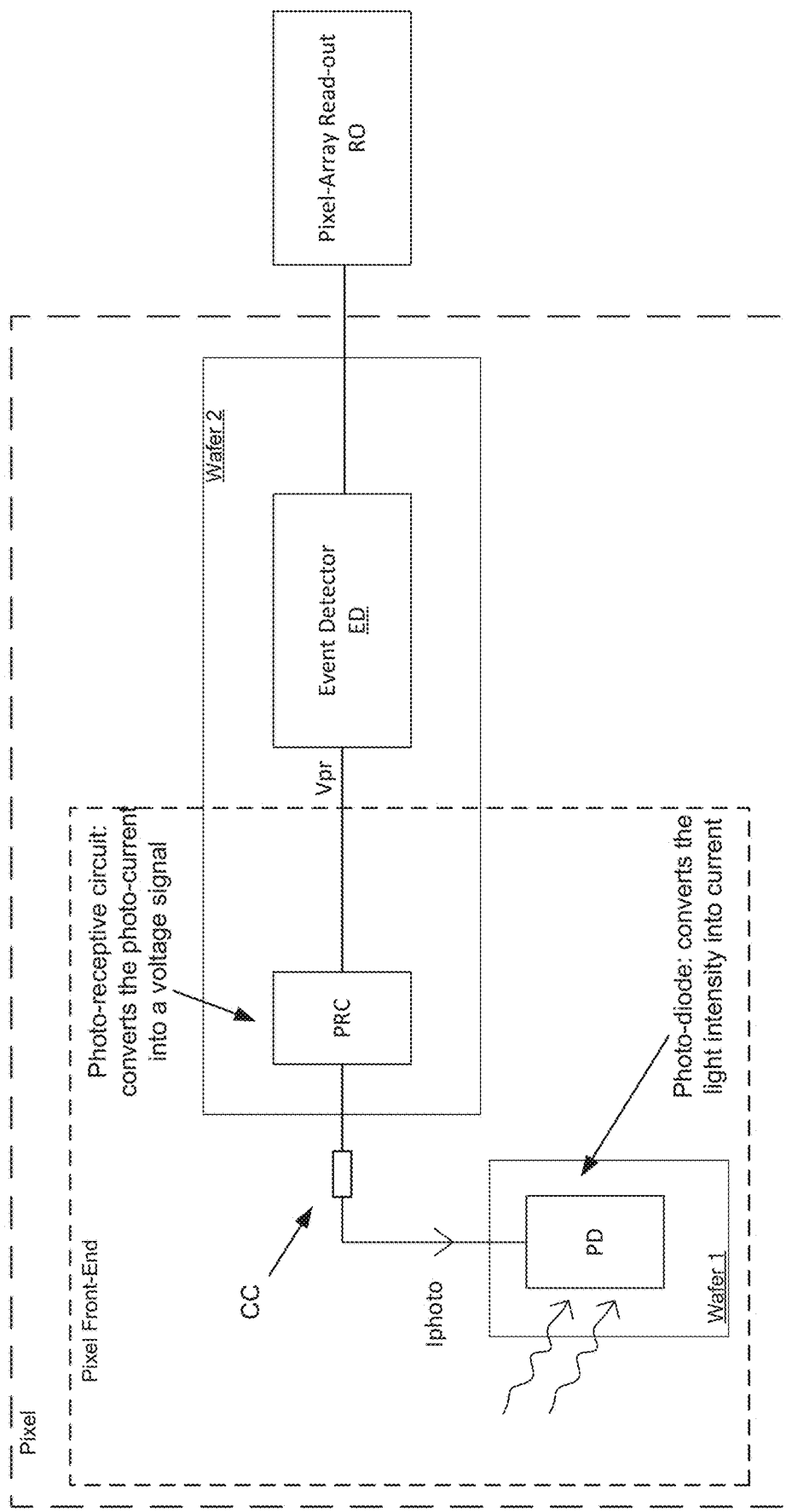

In FIGS. 3A-3C a first (and preferred) embodiment of the proposed invention is presented. In FIGS. 3A and 3B the vertical section of the IC of an EBVS is depicted. In FIG. 3A, the two stacked wafers (or dies) are shown. Connections to the bottom wafer (Wafer 2) are provide by wire bond pads 210 deposited on the top face of the top wafer (Wafer 1). By using TSVs (Through-Silicon Vias) electrical connections are provided through the body of the top wafer Wafer 1. These TSVs end in Cu—Cu connections CC, such as copper ball bumps. In this way, the electrical connections are extended from the bottom of the top wafer to the electrical circuits on the top of the bottom wafer Wafer 2.

Note that in this description, die and wafer are used interchangeably. Generally, a "die" is a piece or a portion of a semiconductor wafer, typically in a rectangular shape, such as a chip. Here, this piece of semiconductor wafer includes a portion of an instance of an integrated circuit device, such as the Event-Based Vision Sensor. The reference to wafer or die is based on the potential for differed fabrication approaches. The stacking can be performed at the wafer-level before dicing into dies. Or, the stacking can be performed on individual dies, after they have been cut away or diced from the wafer. Nevertheless, the final singulated device, i.e., EBVS, resulting from the fabrication process will be a stack of dies.

FIG. 3B shows the detail of the vertical section of a pixel of the EBVS. It's possible to see how the light hits only the surface of the top wafer Wafer 1, on the substrate side (BSI), and how in this wafer only photo-sensitive devices are present, the photodiode PD. Then a single Cu—Cu connection CC per pixel can be used to connect to the bottom wafer (or die). In the bottom wafer Wafer 2, the non-photo-sensitive part of the pixel circuitry is implemented, comparator A1, for example.

FIG. 3C shows a pixel circuit diagram. This example refers to the pixel circuit presented in PCT/IB2017/058526 and U.S. Pub. No. 2018/0191972 and FIG. 1, but other architectures for event detection pixel can be used. It is shown how the circuit is distributed among the two wafers (or dies): on the top wafer/die Wafer 1 only the photo-diode PD is implemented, while the rest of the pixel circuit is implemented in the bottom wafer/die; in every pixel is present a Cu—Cu CC connection between the photo-diode and the photo-receptive circuit. Also shown is the event detector on Wafer 2. The readout circuitry RO could be provided on Wafer 2 or still another wafer or die.

Figure 3D:
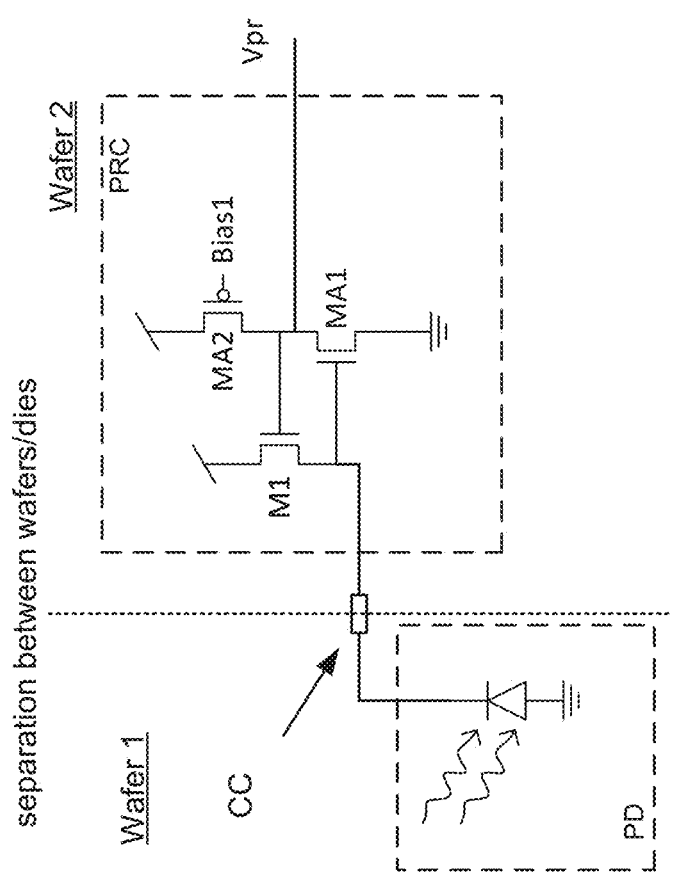

In FIG. 3D the circuit is shown in further detail, by a circuit schematic of the photoreceptor circuit PRC, which is implemented on Wafer 2.

Figure 4A:
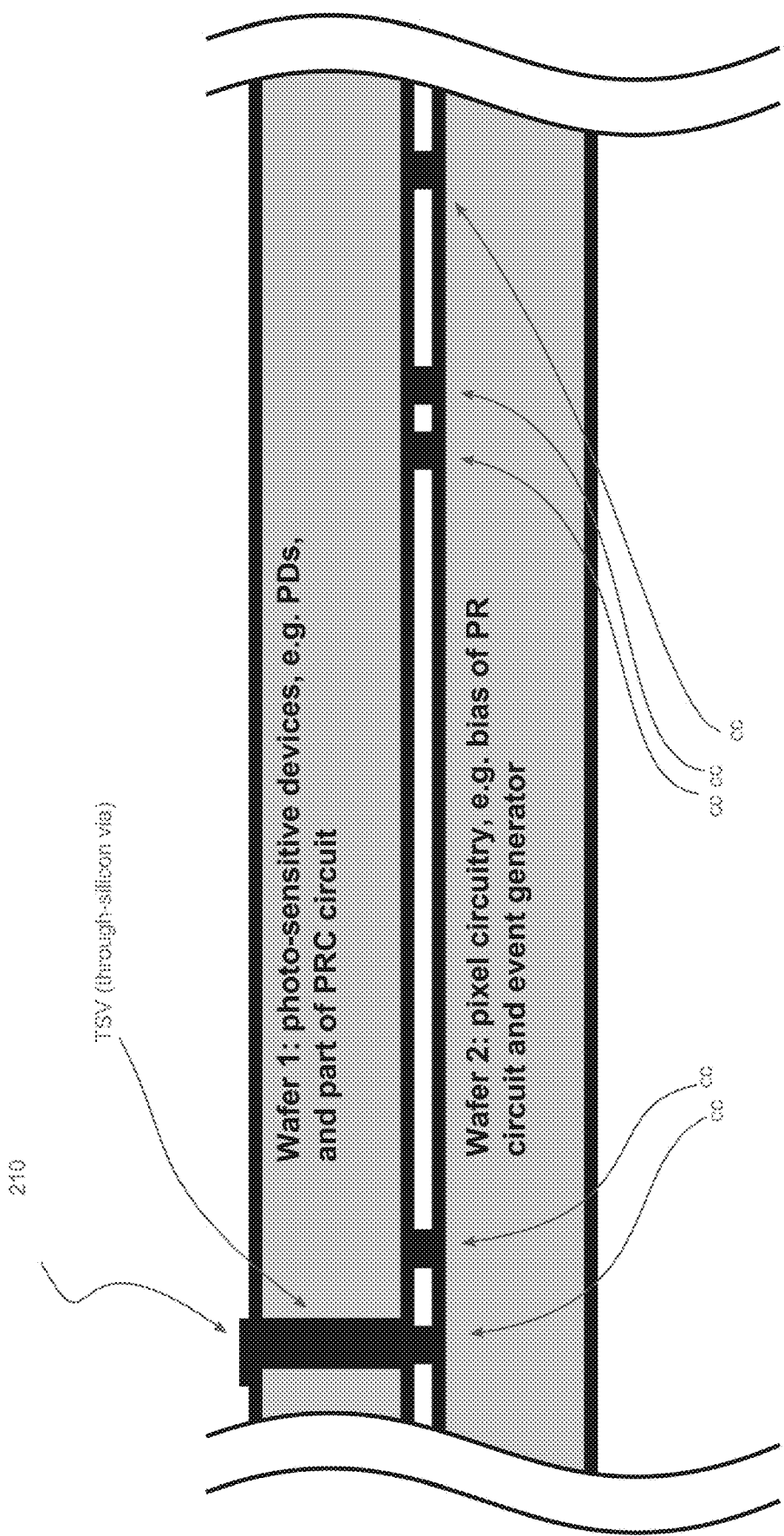
FIGS. 4A-4B: A partial vertical cross-section of two (2) stacked wafers that shows an alternative embodiment, where the top wafer also contains two transistors of the frontend circuit (FIG. 4A); a circuit diagram showing the details of the pixel frontend circuit and how it is arranged between the wafers/dies (FIG. 4B)
Figure 4B:
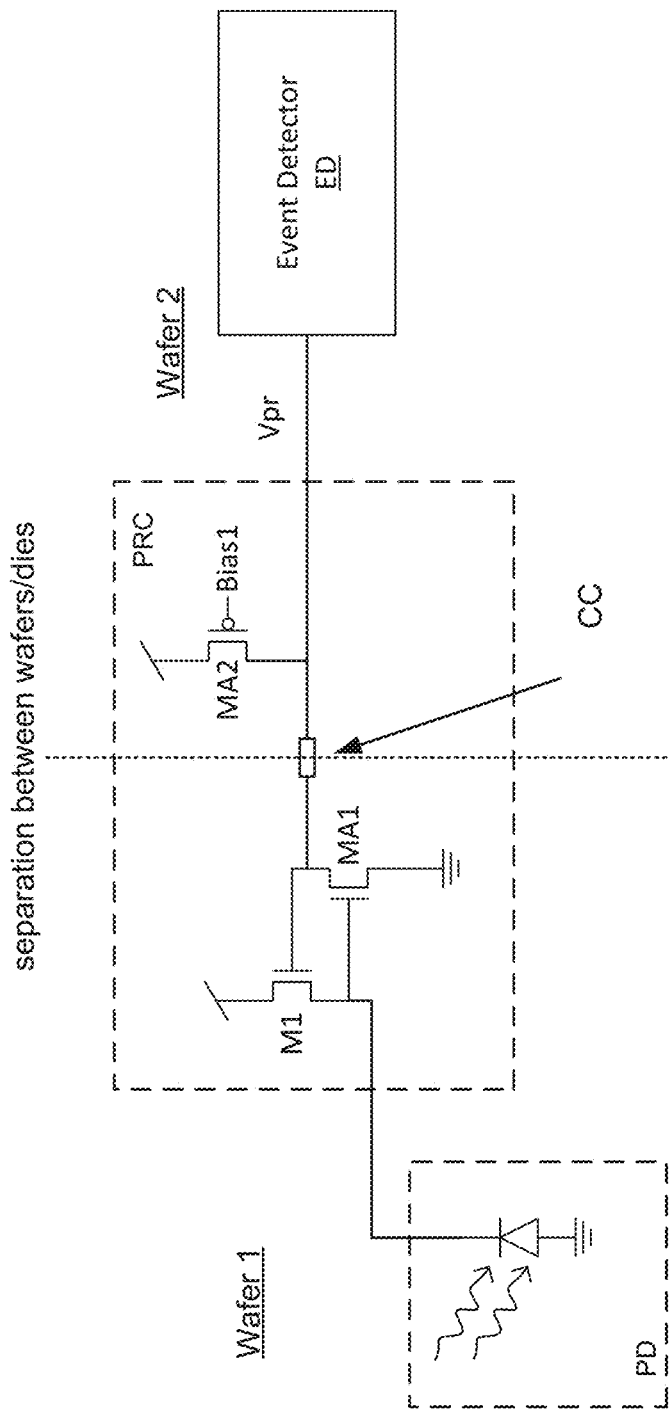

In FIGS. 4A and 4B another embodiment is shown. The circuit chosen for the pixel is the same as the one presented in FIGS. 3C and 3D, but the circuit components are arranged differently among the wafers/dies.

Moreover, a wafer/die partitioning like the one shown in FIG. 4B would also allow to realize the circuitry in the bottom wafer entirely with p-type MOSFET devices, since the Event-Detector can be realized with only p-type devices. This approach is interesting because it allows to further reduce the pixel area, since the entire pixel field can be placed in the same n-well. Typically, a minimum clearance between n-type MOSFET devices and an n-well (where the p-type MOSFET devices sit) must be respected. If there are no n-type devices and all the pixels are included in a single n-well, the area needed for a pixel can be smaller than in the case in which both types of devices are used in every pixel.

As shown in FIG. 4B, in the top wafer Wafer 1, together with the photo-diode PD, two n-FET transistors (M1 and MA1) from the photo-receptive circuit PRC are added. In this way the Cu—Cu connections CC across wafers/dies is between the node that connects to the gate of the feedback transistor M1 and the drain of MA1 and the node that connects to the drain of the bias p-FET transistor MA2 and the input of the event detector, which corresponds to one of the plates of the capacitor C1 in FIG. 1. Using this arrangement, it is possible to improve the performance of the photo-detection, without reducing too much the fill factor and keeping low the complexity of the top wafer (effectively limiting the number of process masks needed for manufacture). The performance is improved especially in terms of noise: a Cu—Cu connection would typically introduce a certain resistance, due to the layers of metals and vias needed to reach the surface of one wafer and then the devices in the other, and this resistance introduces thermal noise. Moreover, this stack of metal layers and vias is typically manufactured using different metals, introducing a noise associated with this metal junctions. For this reason, a solution like the one presented in FIGS. 4A and 4B can be beneficial, without sacrificing too much the benefit on the area occupation introduced in the first place by the wafer/die stacking technology. Also, such a solution allows shrinking the pixel size, because less area is needed on the lower wafer Wafer 2, because less transistors are needed. An additional advantage of this solution (and other solutions that include transistors on both wafers) is that the properties of the two transistors on the upper wafer can be optimized independently from the properties of the transistors on the lower wafer Wafer 2.

In FIGS. 5A-5D, a third embodiment is shown. This is again referred to the circuit presented in the previous embodiments, with the addition in the top wafer Wafer 1 of the bias transistor of the frontend circuit. Eventually, a buffer stage, preferably realized as source-follower amplifier stage, can be added, as well.

This embodiment has the advantage of improving the driving capability of the circuit before the cross-wafer (cross-die) connection. Especially if a buffer stage is added, the resistance of the Cu—Cu CC connection affects less the performance of the frontend, since the load to the output node is reduced. The Cu—Cu connection would be in this case between the output node of the frontend, which now consists, in one example, of the gate of M1, the drain of MA1 and the drain of MA2, and the input of the event detector circuit, which corresponds to one of the plates of the capacitor C1.

The biggest advantage of this approach, however, is related to the fact that the capacitor C1 is typically manufactured as a MIM (metal-insulator-metal) capacitor. This type of device is manufactured using two metal layers that can be the topmost layers of the silicon planar process, or eventually one metal layer below the topmost. The output of the circuit implemented in the top wafer could then be directly connected to the top plate of the MIM capacitor, allowing for the maximization of the dimension of the capacitor, since it can be realized by occupying the entire area of the pixel, since the circuit in the top wafer would not need to connect to any other node, except the top plate of the MIM capacitor C1.

This approach, then, significantly eases the pixel layout, ultimately allowing for a smaller pixel, by distributing the devices wisely between the two wafers/dies.

Figure 5B:
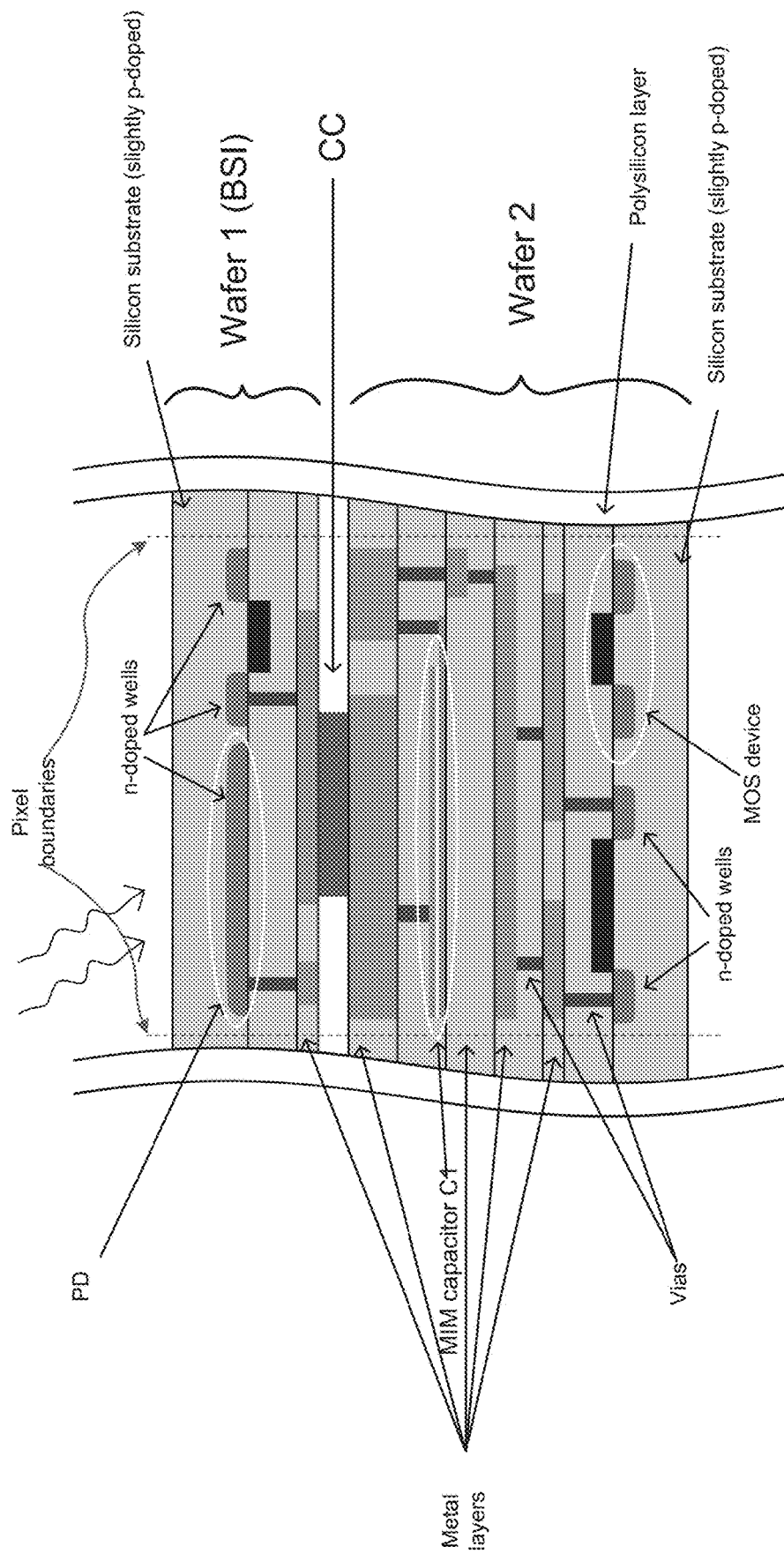

This can be seen in FIG. 5B. It is a simplified representation of the two stacked wafers Wafer 1, Wafer 2, realized in silicon planar process technology, that depicts the various layers that form a wafer. It is possible to see how the last metal layer in the top wafer can be directly connected to one of the plates of the MIM capacitor C1. In this specific representation the top wafer/die is arranged as BSI (backside illuminated), so it receives the light on the substrate side and it is connected to the other wafer using Cu—Cu connections CC, so that the two respective top metal layers of the two wafers/dies are bonded together. For drawing simplicity, the photo-diode junction depicted here is realized as an n-well in a p-substrate, but more advanced structures are actually preferred.

Figure 5C:
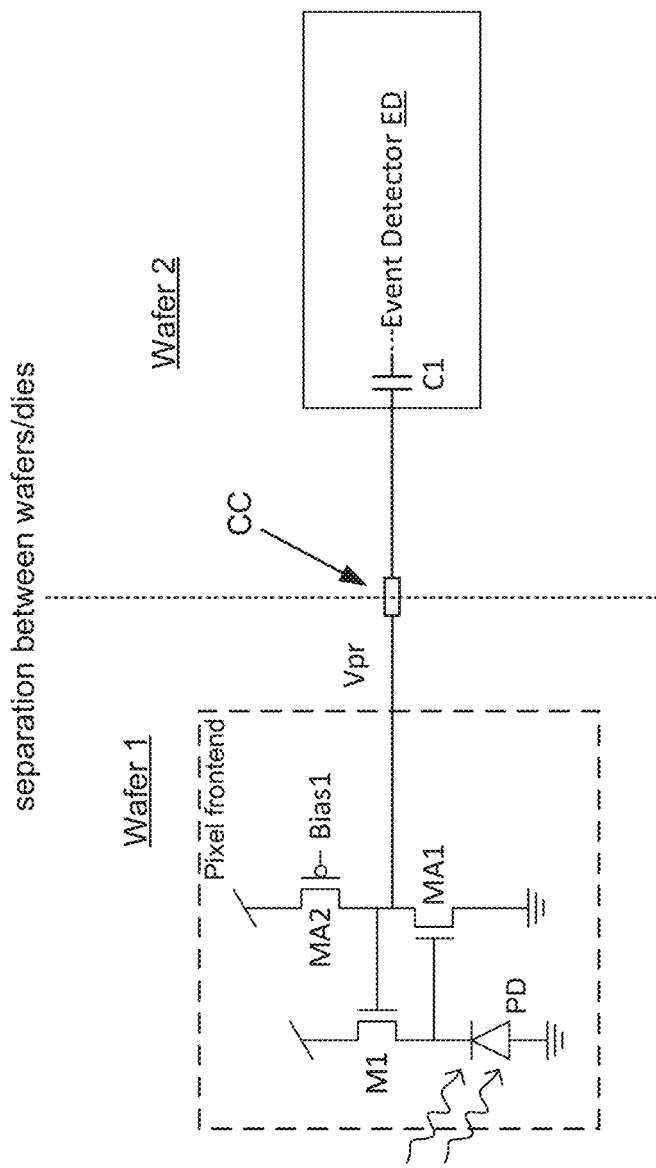
Figure 5D:
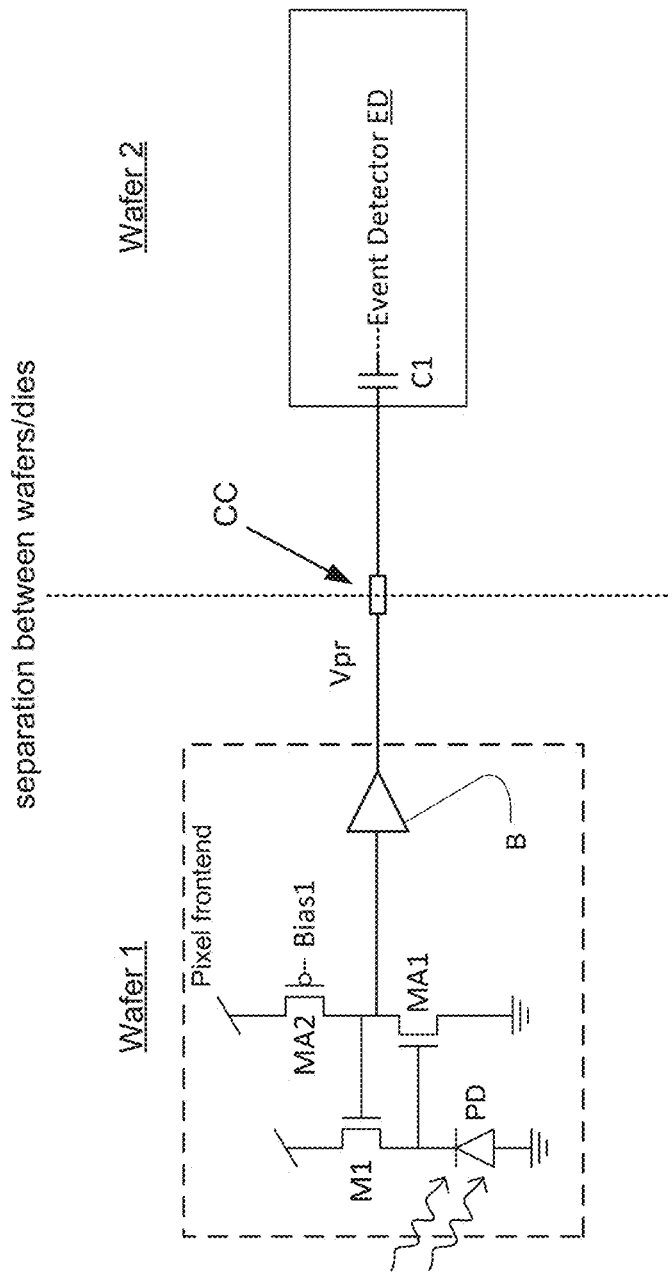

FIG. 5C and FIG. 5D show two different circuit layouts. Specifically, in FIG. 5D, the frontend that includes a buffer amplifier B (preferably a source-follower amplifier).

A FSI (front-side illuminated) approach for the top wafer could be realized, connecting it to the bottom wafer using TSVs (through-silicon vias).

Using this same approach and the same arrangement of transistors between the two wafers (or dies), the MIM capacitor C1 could be alternatively placed in the top wafer (or die) Wafer 1, instead of in the bottom wafer (or die) Wafer 2. Such an approach could be justified, for example, by specific consideration on the metal layers, in order to distribute them among the wafers (or dies) according to the most cost-effective solution: the two wafers could be realized in two different technology, and in one of these technology processes adding metal layers, or MIM specific metal layers, could be less expensive than in the other process.

In all the wafer representations showed along the documents, on the side exposed to the light a layer stack that implements micro-lenses and/or light waveguides can be added, to improve the QE of the photo-receptors, but it has not been depicted in the figures for simplicity.

Figure 6A:
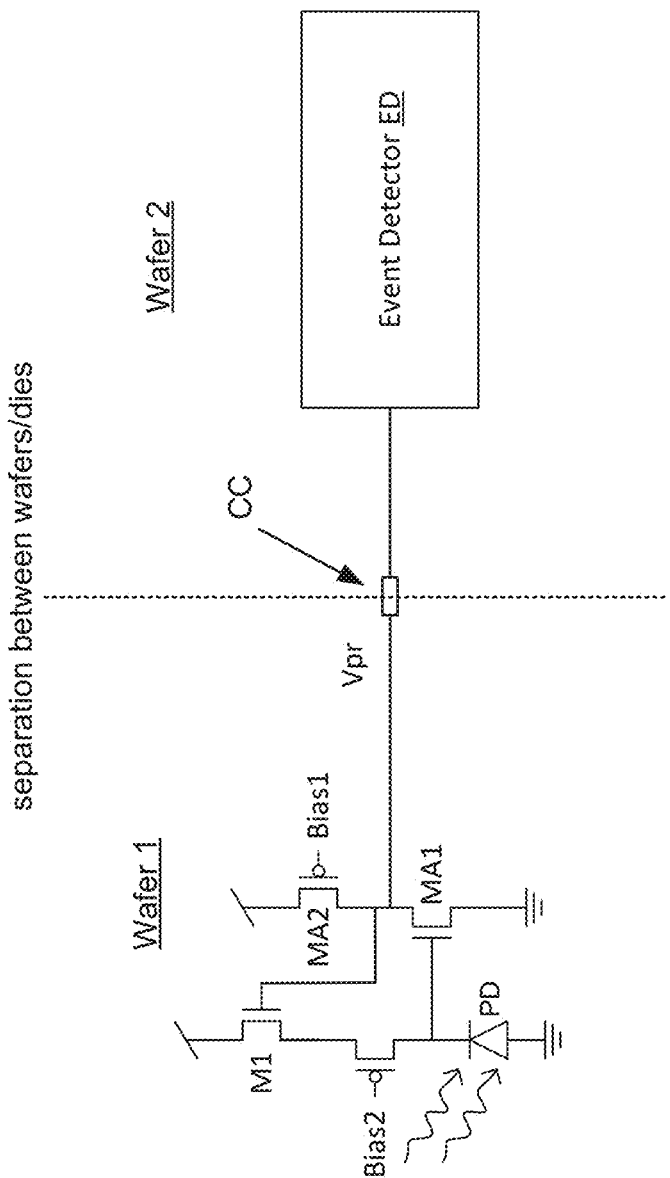
FIGS. 6A-6B: A circuit diagram showing an alternative pixel frontend circuit, with an additional p-FET that improves performance (FIG. 6A); a circuit diagram showing the separation between the wafers/dies (FIG. 6B)

In FIG. 6A an alternative embodiment for the pixel frontend is depicted. In this case, as well, only one cross-wafer (or die) connection per pixel is needed. The top wafer Wafer 1 contains, together with the photo-diode PD, the transistors that form the pixel frontend including the photoreceptor circuit PRC.

Figure 6B:
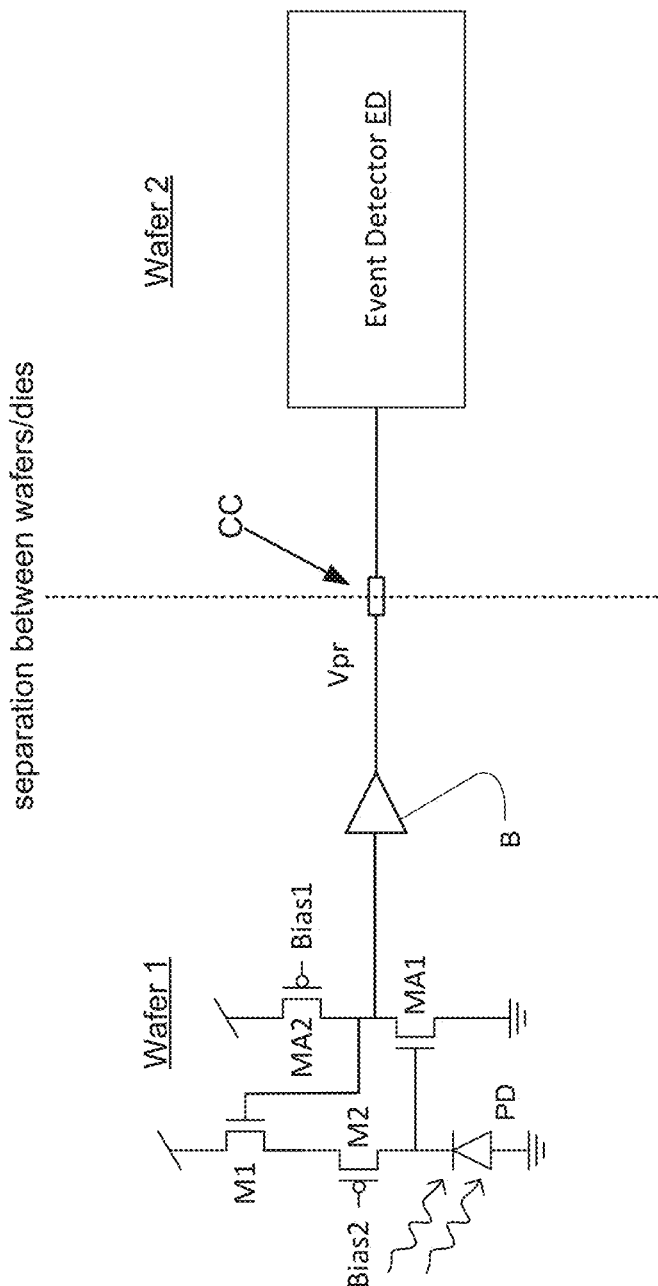

In FIG. 6B it is showed how it could be eventually added an amplification stage B, preferably realized as a source-follower amplifier, and how it could also be included in the top wafer Wafer 1. This would have the advantage of improving the driving capabilities of the frontend, effectively limiting the load on the output node of the frontend (gate of M1, drain of MA1 and drain of MA2). As a matter of fact, the Cu—Cu CC connection can have a non-negligible resistance that would be directly loaded to the output of the frontend, if there was not any amplification stage.

Figure 7A:
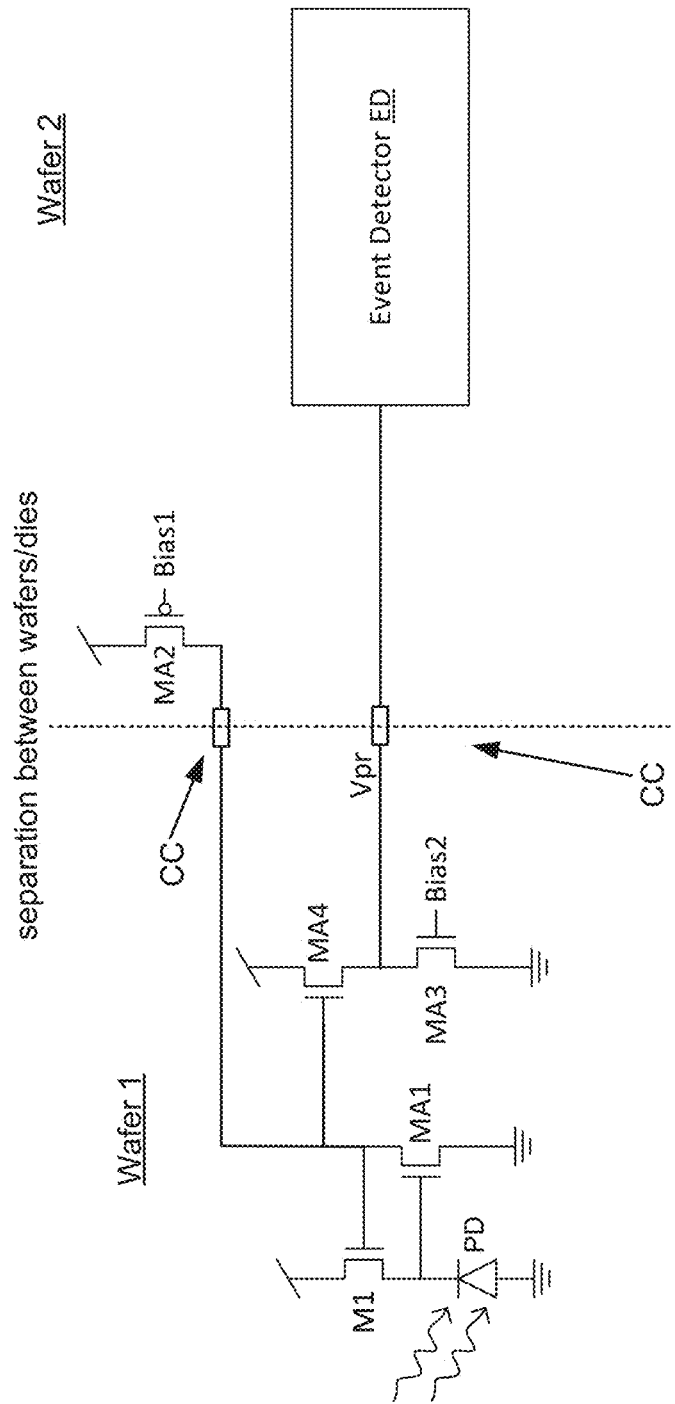
FIGS. 7A-7C: Three circuit diagrams showing variations of the pixel frontend circuit, in which multiple Cu—Cu connections in every pixel are needed.

In FIG. 7A the pixel fronted circuit, the similar to that shown in FIG. 5B, is depicted, with the amplification stage explicitly represented as a source-follower amplifier, realized with n-FET MOS devices. The solution proposed here does not have p-FET devices in the top wafer, so the cross-wafer (or die) connections required are more than one, here specifically two per pixel.

The choice of not having p-FET MOS devices in the top wafer has the advantage of improving the QE, because if n-wells are present in the illuminated wafer, they attract carriers generated by the impinging light, acting as parasitic photo-diodes connected between the supply voltage and ground.

Figure 7B:
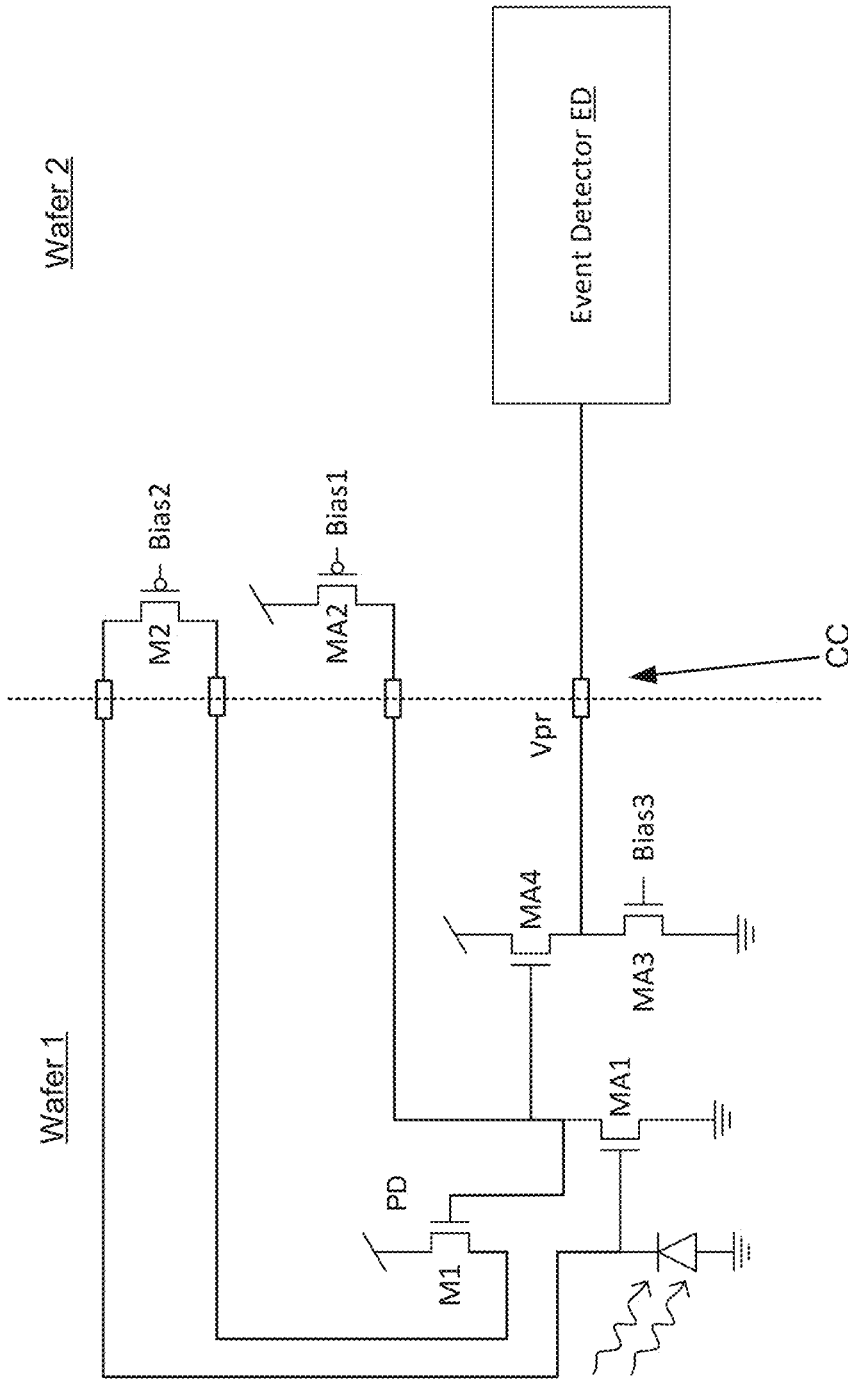
Figure 7C:
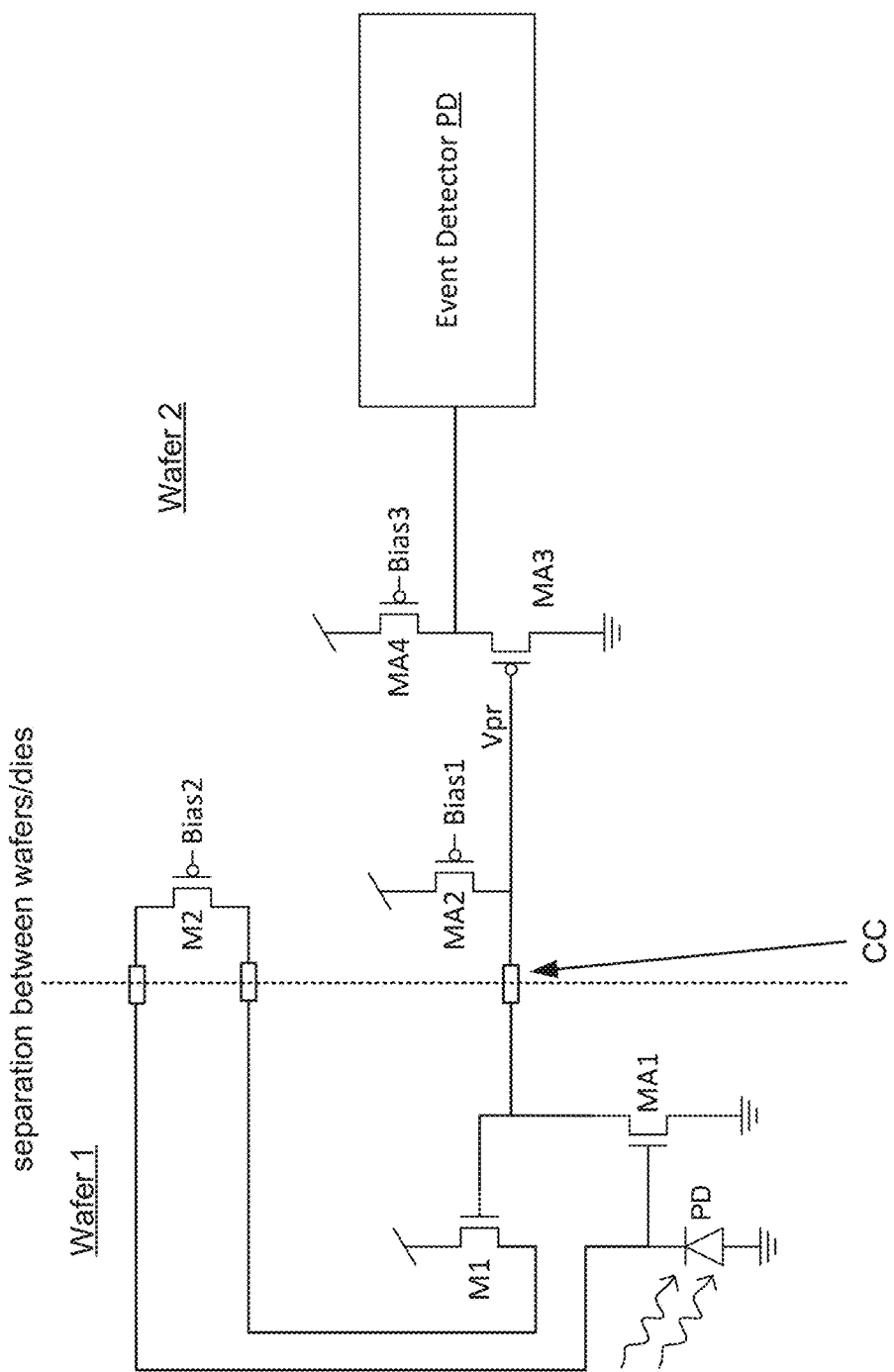

In FIG. 7C the alternative pixel frontend implementation is shown, the same as the one in FIG. 6B. In this proposed embodiment, as in FIG. 7A the top illuminated wafer does not contain p-FET MOS devices, and for this reason multiple cross-wafer (or die) connections per pixel are required, in this particular case, four per pixel are needed. The buffer stage is realized as a source follower amplifier, consisting of n-FET devices.

In FIG. 7C the same pixel architecture used in FIG. 7B is shown, but the source-follower amplifier that acts as buffer is realized with p-FET MOS devices. In this way, one connection per pixel can be spared, requiring only three.

In general, it is possible to section the pixel circuitry in many different ways, all of them with possible advantages and drawbacks. For example, if the focus is on finding the best technology for each of the parts of the circuit, it can be thought of separating between digital and analog part of the circuit. Moreover, the stacking technology does not pose theoretical limits to the number of wafers/dies that could be stacked together and connected vertically, by the use of Cu—Cu connections and TSVs, for instance. The connections can be placed in every pixel, or on the edges of the pixel array, for example once per column and/or once per row.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method of operation of an Event-Based Vision Sensor, the method comprising:
 detecting light with photodiodes of each pixel of a pixel array are in a first die; and
 detecting events with event detectors of the pixel array in a second die.

2. The method of claim 1, wherein interconnections between the first die and the second die connect the photodiodes with the event detectors.

3. The method of claim 1, further comprising connecting each of the pixels using Cu—Cu connections between the first wafer or die and the second wafer or die.

4. The method of claim 1, wherein the event detector are shared between a s the pixels in the second wafer or die.

5. The method of claim 1, wherein the event detectors are provided for each pixel of the pixel array in the second wafer or die.

6. The method of claim 1, wherein the first wafer or die uses a frontside illumination architecture.

7. The method of claim 1, wherein the first wafer or die uses a backside illumination architecture.

8. The method of claim 1, wherein a photoreceptor circuit of each pixel of the pixel array is located on the second wafer or die.

9. The method of claim 1, wherein a photoreceptor circuit of each pixel of the pixel array is located on the first wafer or die.

10. The method of claim 1, wherein a photoreceptor circuit of each pixel of the pixel array is distributed between the first wafer and the second wafer or die.

* * * * *

UNITED STATES PATENT AND TRADEMARK OFFICE
CERTIFICATE OF CORRECTION

| | |
|---|---|
| PATENT NO. | : 11,652,126 B2 |
| APPLICATION NO. | : 17/161961 |
| DATED | : May 16, 2023 |
| INVENTOR(S) | : Raphael Berner et al. |

It is certified that error appears in the above-identified patent and that said Letters Patent is hereby corrected as shown below:

In the Claims

In Claim 4, Column 10, Line 67 delete "s," and insert --subset of--, therefor.

Signed and Sealed this
Twenty-seventh Day of June, 2023

Katherine Kelly Vidal
*Director of the United States Patent and Trademark Office*